United States Patent [19]

Wiblin et al.

[11] Patent Number: 4,584,472
[45] Date of Patent: Apr. 22, 1986

[54] LINEAR POSITION ENCODER

[75] Inventors: Wayne T. Wiblin, Ashtabula; Ronald D. Surma, Madison; Grant C. Melocik, Chardon, all of Ohio

[73] Assignee: Caterpillar Industrial Inc., Mentor, Ohio

[21] Appl. No.: 582,114

[22] Filed: Feb. 21, 1984

[51] Int. Cl.⁴ .............................................. H01J 3/14
[52] U.S. Cl. .................................. 250/237 G; 250/229
[58] Field of Search ........ 250/231 SE, 237 G, 237 R, 250/229; 340/347 P; 356/395; 33/169 R, 174 L

[56] References Cited

U.S. PATENT DOCUMENTS

| | | | |
|---|---|---|---|
| 3,796,498 | 3/1974 | Post | 356/169 |
| 4,011,448 | 3/1977 | Hordeski | 250/237 |
| 4,110,611 | 8/1978 | Tann et al. | 250/237 |
| 4,342,910 | 8/1982 | Pfeifer et al. | 250/237 |
| 4,429,219 | 1/1984 | Yochum et al. | 250/237 G |

FOREIGN PATENT DOCUMENTS 0007267 1/1980 European Pat. Off. .

Primary Examiner—David C. Nelms
Attorney, Agent, or Firm—Stephen L. Noe

[57] ABSTRACT

Information related to the position of a control member of a vehicle is required for control of power delivered to the vehicle motors. Available linear position encoders are expensive and prone to damage in an industrial environment. The instant apparatus provides a simple and durable linear position encoder having a piston adapted to move within a housing. A plurality of sensors are each positioned along a different housing pathway and a plurality of sensible members are each positioned along a different piston pathway. In response to movement of the piston within the housing the sensors deliver respective position signals to an electric circuit means, which, in turn, delivers respective coded digital signals to a vehicle controller. The apparatus is digital in design and is of simple, rugged, and inexpensive construction.

16 Claims, 8 Drawing Figures

LINEAR POSITION ENCODER

DESCRIPTION

1. Technical Field

This invention relates generally to an apparatus for encoding the position of a member and, more particularly, to an apparatus for sensing the position of a control member of a vehicle and delivering a digital signal in response to the sensed position.

2. Background Art

Certain classes of vehicles are known to require information concerning the position of a control member of the vehicle, for example, an accelerator pedal or lever, in order to properly control the vehicle. For example, industrial electric vehicles or lift trucks commonly have a pair of driven traction wheels mounted opposite one another on the vehicle. The traction wheels are driven by one or more motive power devices, for example, electric motors. The power delivered to the motors is typically governed by a motor controller in response to a power demand signal. The power demand signal is produced by encoding the position of the accelerator pedal or other control member of the vehicle.

Linear position encoders, suitable for use as accelerator position encoders in a vehicle, are available commercially. One type of encoder often encountered utilizes a conventional potentiometer type rotary encoder adapted with suitable linkage to encode linear position. The shaft of the potentiometer is driven by movement of the control member and an analog voltage signal is taken from the wiper element of the potentiometer. Potentiometers are prone to wear along the contact surface, are easily damaged by mechanical vibration, and are generally unreliable in an industrial environment. Furthermore, the analog output of a potentiometer is not readily used by a modern digital vehicle controller and must be converted from the analog to the digital domain.

Another type of known encoder utilizes an optical system to read index marks carried on a printed or etched film. In response to movement of the control member, the film is moved relative to the optic system, and the presence and absence of index marks at predetermined locations is encoded as the position of the control member. Encoders having such a film are functionally dependent on the difference in optical density between the portion of the film with index marks and the portion without marks. Smoke and other optical contaminants in an industrial environment can discolor the portion of the film without marks to the extent that the marks cannot be reliably distinguished by the optical system.

The present invention is directed to overcoming one or more of the problems as set forth above.

DISCLOSURE OF THE INVENTION

In one aspect of the present invention, a position encoder is provided for sensing a plurality of positions of a control member of a vehicle. The encoder includes a base having first and second end portions and a central axis passing through the end portions, and a moveable member having an end portion passing through one of the base end portions and connected to the control member. The moveable member is positioned for movement along the axis in response to movement of the control member and includes a first mounting surface having a plurality of spaced apart pathways positioned substantially parallel to one another and to the axis. A plurality of sensible members are mounted on the first mounting surface along the pathways. A mounting member has a second mounting surface positioned substantially parallel to the first mounting surface and has a plurality of spaced apart pathways aligned with respective ones of the pathways on the first mounting surface. A plurality of sensors are mounted on the second mounting surface, each along a different one of the base pathways.

The apparatus of the present invention facilitates obtaining digital position signals in response to the position of the control member of the vehicle. The apparatus is advantageously digital in design, and is of simple, rugged, and inexpensive construction.

BRIEF DESCRIPTION OF THE DRAWINGS

For a better understanding of the present invention, reference may be made to the accompanying drawings, in which.

BEST MODE FOR CARRYING OUT THE INVENTION

Figure 1:
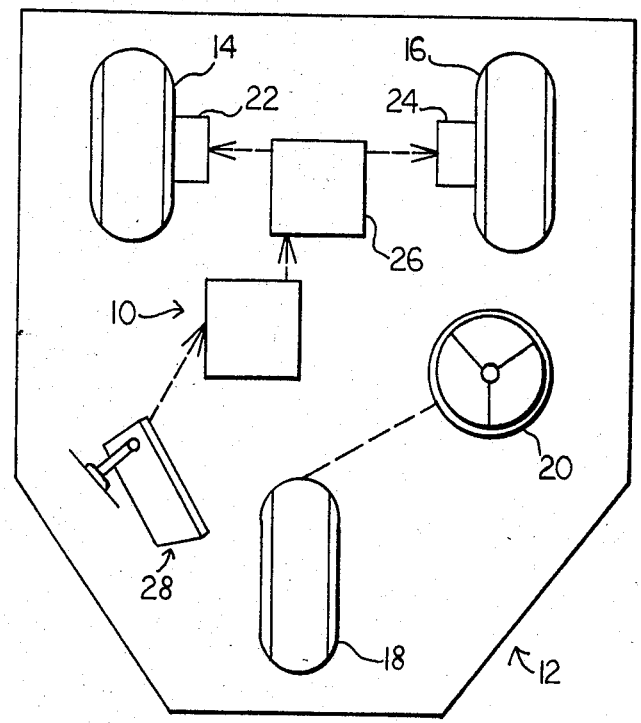
FIG. 1 is a schematic view of a vehicle including the present invention.

Referring first to FIG. 1, a position encoder embodying the principles of the present invention is generally indicated by the reference numeral 10. It should be understood that the following detailed description relates to the best presently known embodiment of the position encoder 10. However, the position encoder 10 can assume numerous other embodiments, as will become apparent to those skilled in the art, without departing from the appended claims.

The position encoder 10 is shown in conjunction with a vehicle 12, for example, an industrial vehicle such as a lift truck. The vehicle 12 includes left and right traction wheels 14,16 and a steerable wheel 18. The direction of the steerable wheel is controllable by a steering wheel 20. The traction wheels 14,16 are independently driven by respective electric motors 22,24. The speed and direction of rotation of the motors 22,24 is controlled by a vehicle controller 26. A speed demand control member 28, for example, an accelerator pedal or lever, is connected to the position encoder 10. An output from the position encoder 10 is directed to the vehicle controller 26.

Figure 4:
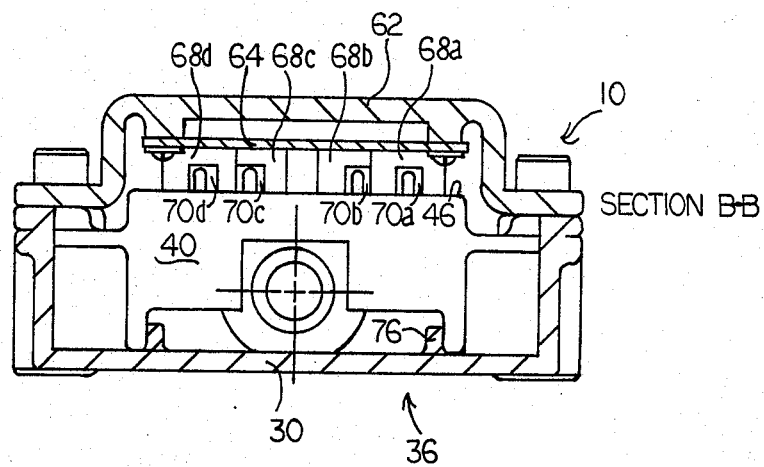
FIG. 4 is an end, partially sectioned projection of the embodiment of FIG. 2.
Figure 2:
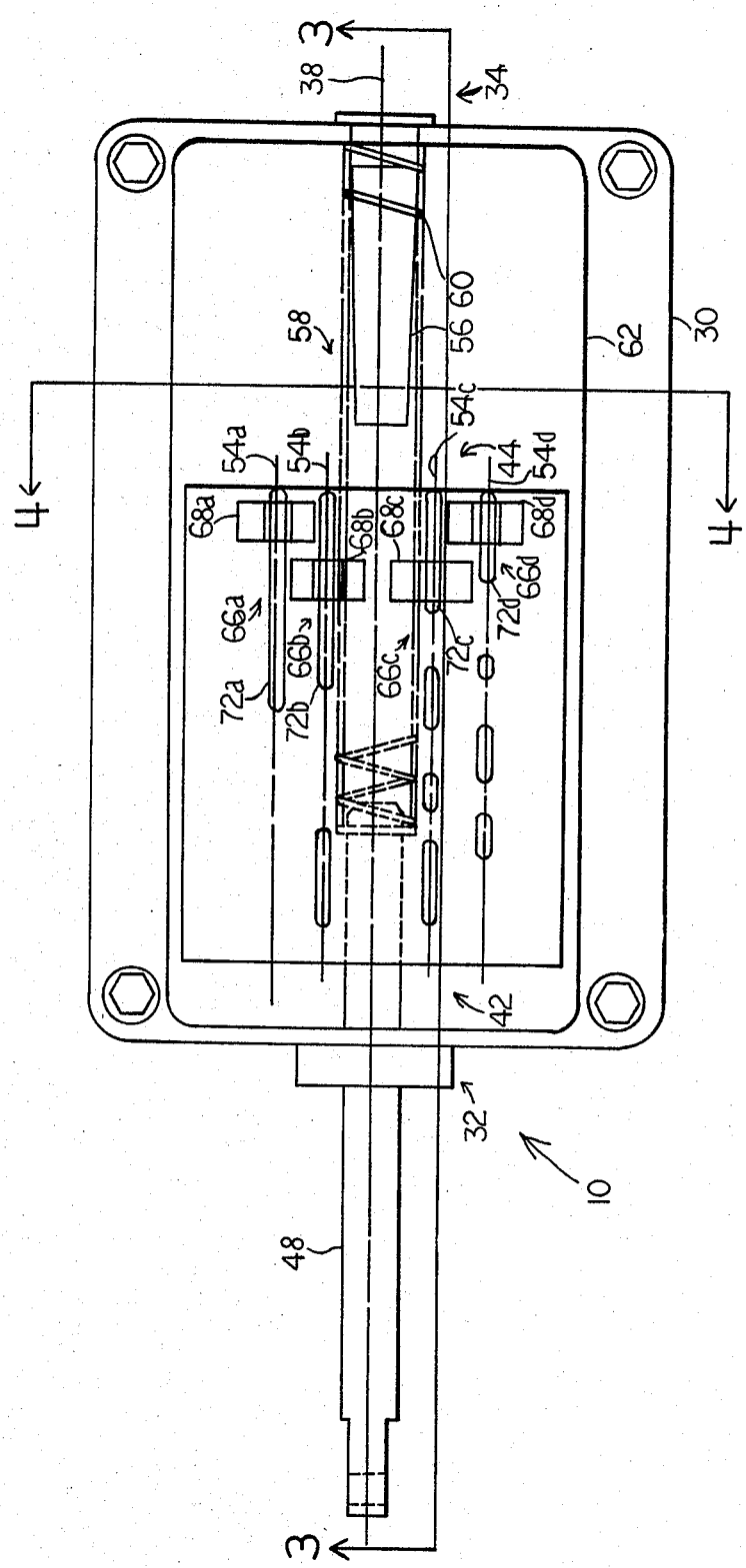
FIG. 2 is a top projection of an embodiment of the present invention.
Figure 3:
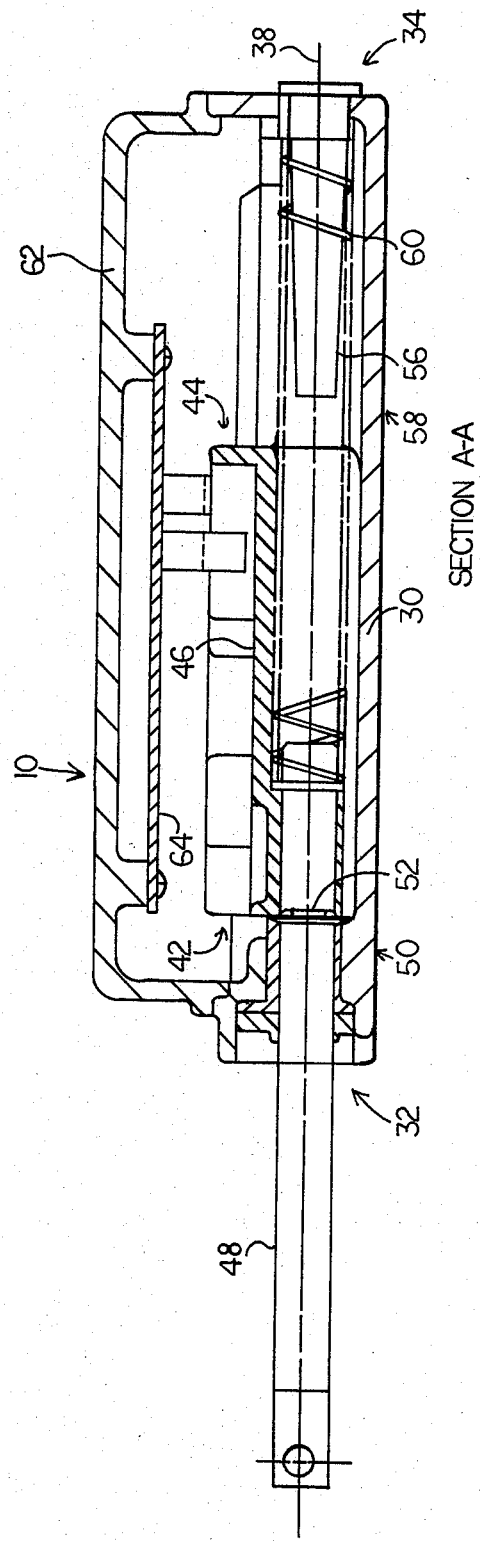
FIG. 3 is a front, partially sectioned projection of the embodiment of FIG. 2.

FIGS. 2, 3, and 4, taken as a whole, show details of the construction of an embodiment of the position encoder 10. Note that in FIGS. 2, 6, and 7 various elements are drawn in solid outline form for convenient illustration and ease of understanding. These elements would not normally be visible in a regular top projection of the position encoder 10.

A base 30 has first and second end portions 32,34. A central longitudinal axis 38 passes through the end portions 32,34. A moveable member 40 having first and second end portions 42,44 and a substantially planar first mounting surface 46 is moveable along the central axis 38 between the first and second base end portions 32,34 in response to movement of the control member 28. The first mounting surface 46 includes a plurality of spaced apart pathways 54a-d extending along the first mounting surface 46 substantially parallel to one another and to the central axis 38.

A shaft 48 is attached to the moveable member first end portion 42 and passes through the base first end portion 32. The shaft 48 is, for example, connected to the control member 28. The shaft 48 preferably has a shock absorbing member 50 connected to the shaft 48 between the moveable member first end portion 42 and the base first end portion 32. The shock absorbing member 50 is, for example, a bevel washer 52 positioned on the shaft 48. The washer 52 extends outwardly from the shaft 48.

A projection 56 is attached to the base second end portion 34 and extends along the axis 38 toward the base first end portion 32. The projection 56 is, for example, a plastic pin located in the base second end portion 34.

The position encoder 10 also includes a means 58 for urging the piston 40 along the axis 38 toward the base first end portion 32. The urging means 58 includes a spring 60 compressably positioned between the moveable member second end portion 44 and the base second end portion 34. The spring 60 is positioned about and retained by the projection 56. A first end of the spring 60 abuts the moveable member second end portion 44 and a second end of the spring 60 abuts the base second end portion 34.

A mounting member 62 has a substantially planar second mounting surface 64 positioned substantially parallel to and spaced apart from the first mounting surface 46. The second mounting surface 64 has a plurality of spaced apart pathways 66a-d extending substantially parallel to one another along said second mounting surface 64. Each of the pathways 66a-d is aligned with a respective one of the first mounting surface pathways 54a-d.

The second mounting surface 64 is, for example, a printed circuit board and the second mounting surface pathways 66a-d are mounting locations on the circuit board. A plurality of sensors 68a-d are mounted on the second mounting surface 64. Each of the sensors 68a-d is mounted along a different one of the second mounting surface pathways 66a-d. In the preferred embodiment, the sensors 68a-d are opto-isolators such as model number OPB 804 manufactured by TRW Inc. of Carrollton, Tex. As is familiar to those skilled in the art, each of the sensors 68a-d includes a light emitting and receiving device and an optical path 70a-d intermediate the emitting and receiving devices.

A plurality of sensible members 72a-d are mounted on the first mounting surface 46. The sensible members 72a-d are mounted along the first mounting surface pathways 54a-d and extend toward the second mounting surface 64. The sensible members 72a-d are of a construction and location sufficient for sensing by respective ones of the sensors 68a-d in response to the position of the moveable member 40 along the central axis 38 between the base first and second end portions 32,34.

Figure 5:
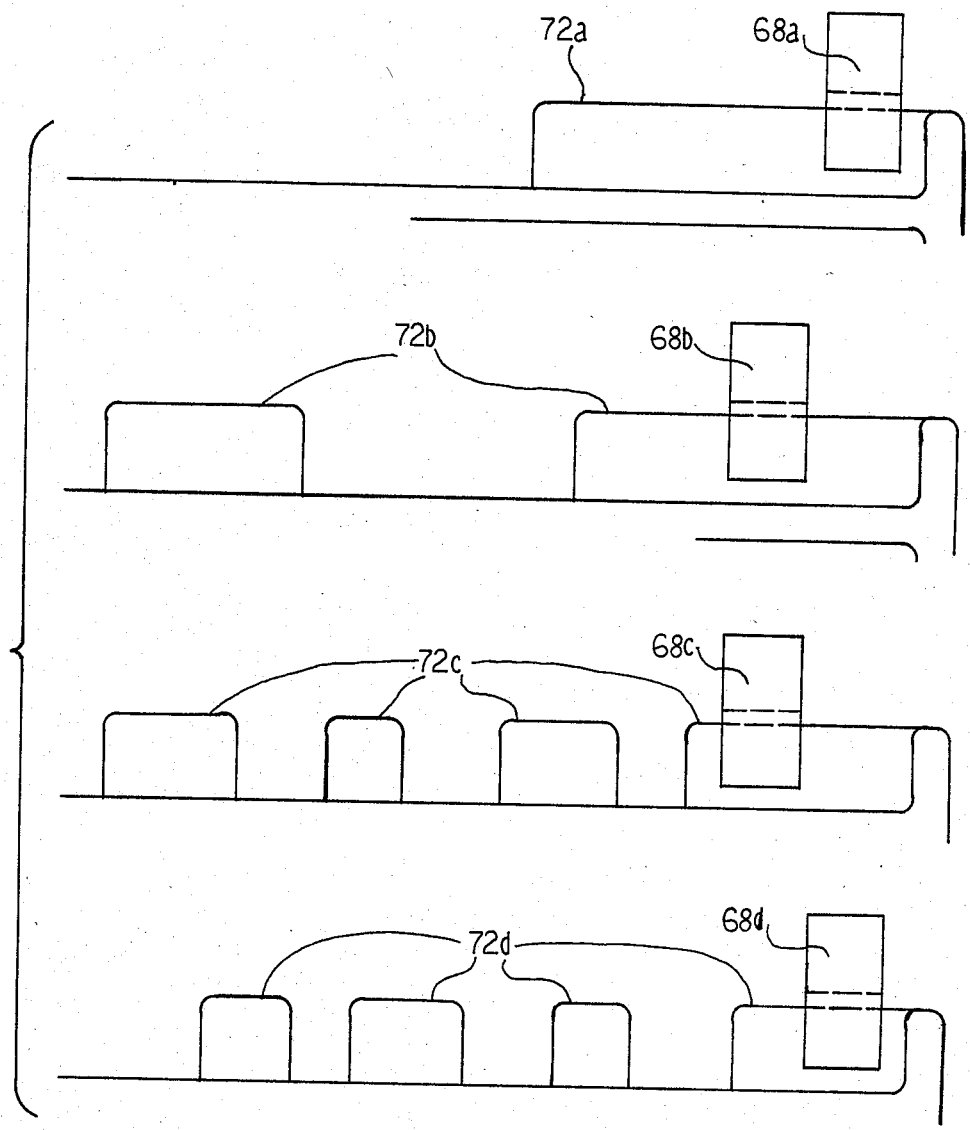
FIG. 5 is an illustration of a plurality of sensible members used in the embodiment of FIG. 2.

In the preferred embodiment, the sensible members 72a-d are light blocking fins extending substantially perpendicularly from the first mounting surface 46. The fins are of a predetermined size and are spaced intermittently at predetermined locations along the pathways 54a-d, as is best shown in FIG. 5. The first and second mounting surface pathways 54a-d, 66a-d define the area and orientation upon which the respective sensible members 72a-d and sensors 68a-d are located. The sensible members 72a-d and sensors 68a-d are of a predetermined number, size, and location sufficient to provide a gray coded position signal as is hereinafter described. The presence of a fin within a respective one of the optical paths 70a-d is sufficient to interrupt the transmission of light from the respective optical emitter to receiver.

Figure 6:
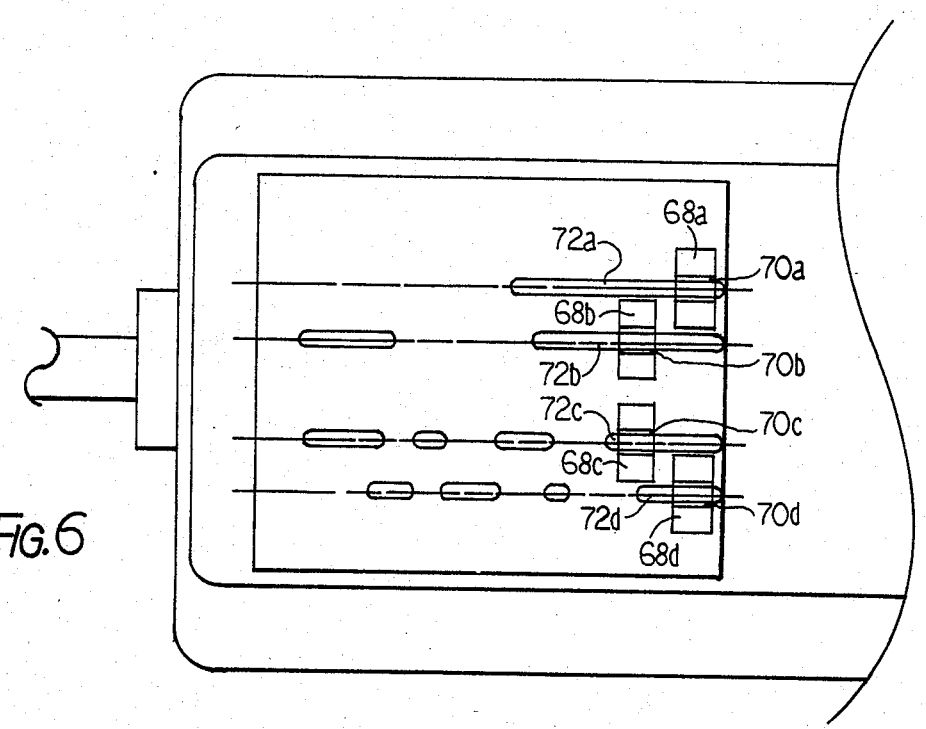
FIG. 6 is an illustrative partial top view of the embodiment of FIG. 2 under a first set of conditions.
Figure 7:
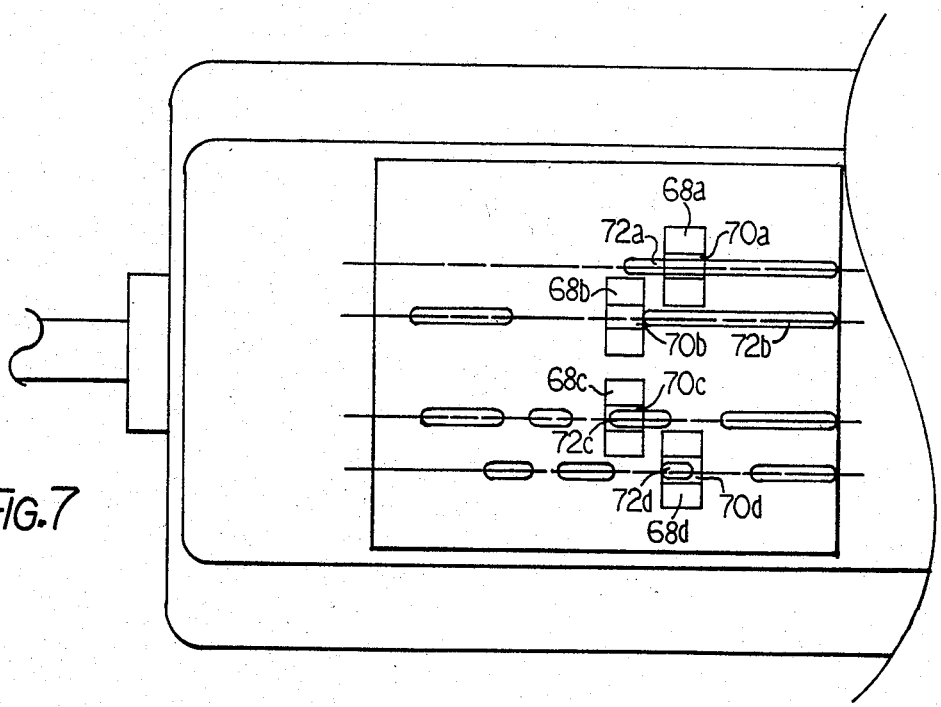
FIG. 7 is an illustrative partial top view of the embodiment of FIG. 2 under a second set of conditions.

Reference to FIGS. 6 and 7 serves to clarify the relationship between the sensors 68a-d and sensible members 72a-d in response to two different positions of the moveable member 40. In FIG. 6 the moveable member 40 is at a first position and each of the sensor optical paths 70a-d is blocked by a respective one of the sensible members 72a-d. In FIG. 7, the moveable member 40 is at a second position different from the first position. In response to the different position of the sensible member 40, three of the sensor optical paths 70a,c,d are blocked by respective ones of the sensible members 72a,c,d and the one remaining sensor optical path 70b is free from being blocked. The result of the interruption and freedom from interruption of the optical paths 70a-d is described below with reference to FIG. 8.

Those skilled in the art will recognize that, although light blocking sensible members 72a-d and optical sensors 68a-d are used in the preferred embodiment, other sensing arrangements and constructions utilizing Hall effect devices, etc., can be readily incorporated in the position encoder 10.

As shown best in FIG. 4, the moveable member 40 and at least one of the base 30 and moveable member 62 includes one or more adjacent engageable surfaces 36. At least one of the engageable surfaces 36 includes a plurality of spaced apart ribs 76. The ribs 76 extend outwardly from and substantially perpendicular to the respective engageable surface 36, and are substantially parallel to the central axis 38. The ribs 76 are in sliding engageable contact with the other of the adjacent engageable surfaces 36. The interaction between the ribs 76 and the engageable surfaces 36 serves to maintain alignment of the moveable member 40 within the base 30, advantageously forming a low friction interface by minimizing the contact area between the moveable member 40 and the base 30.

Figure 8:
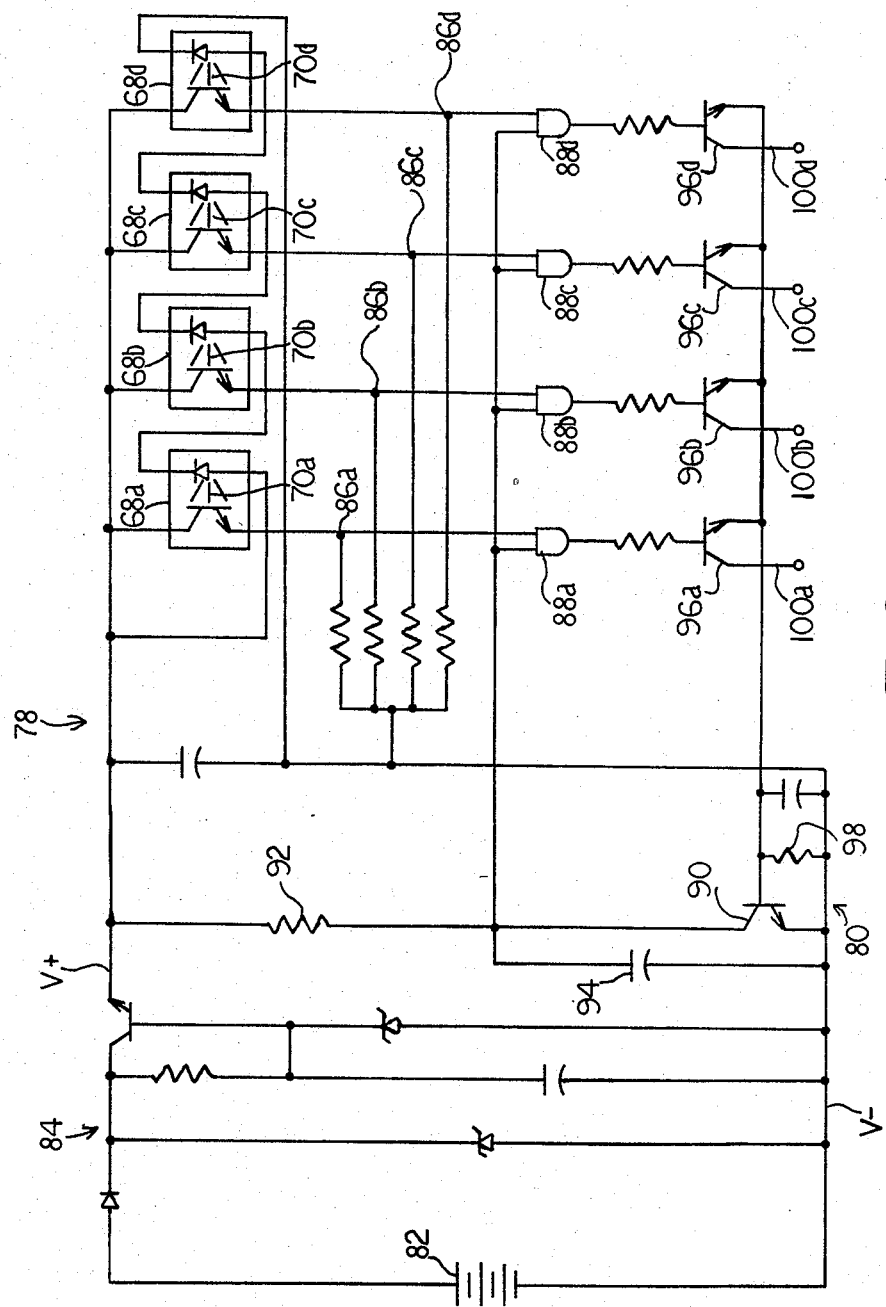
FIG. 8 is a schematic representation of an electric circuit used in an embodiment of the present invention.

Referring now to FIG. 8, each of the sensors 68a-d is adapted to deliver a position signal in response to the relative position of the sensible members 72a-d and the respective sensors 68a-d. The position encoder 10 includes electric circuit means 78 for receiving the position signals from each of the sensors 68a-d, controllably combining the received signals, and delivering one of a plurality of predetermined coded digital signals in response to the received signals. The electric circuit means 78 includes protection means 80 for producing a predetermined one of the coded digital signals in response to a predetermined fault condition of the electric circuit means 78.

In the preferred embodiment, power is supplied to the electric circuit means 78 from a battery 82 associated with the vehicle 12. Power can also be supplied by another suitable source independent of the vehicle 12. A conventional voltage regulator 84 is connected to the battery 82 and delivers regulated DC power to respective positive and negative lines V+ and V− of the electric circuit means 78.

The sensor light emitters are a plurality of light emitting diodes connected in series with one another between V+ and V−. The sensor light receivers are a plurality of photo-transistors, each having a collector connected to V+ and an emitter connected to a respective output line 86a-d. Light produced by the sensor light emitters is projected across respective optical paths 70a-d and is received by respective sensor light receivers. Each output line 86a-d is connected through a respective resistor to V−. A plurality of "AND" circuits 88a-d each has a first input connected to a respective one of the output lines 86a-d.

The protection means 80 includes a transistor 90 having a collector connected through a resistor 92 to V+ and an emitter connected to V−. A second input of each of the "AND" circuits 88a-d is connected to the collector of the transistor 90 and to V− through a capacitor 94. An output of each of the "AND" circuits 88a-d is connected through a respective resistor to a base of a respective output transistor 96a-d. An emitter of each of the output transistors 96a-d is connected to a base of the transistor 90 and to V− through a current sensing resistor 98. A collector of each of the output transistors 96a-d is connected to a respective digital output line 100a-d.

The ratings and values shown for various electric elements discussed above are for exemplary purposes only. Alterations of the circuit and embodiment discussed and the use of electric elements of different constructions or ratings will be readily apparent to those skilled in the art. Such alterations or substitutions can be implemented without departing from the appended claims.

TABLE I

| Control Member (28) Position | Moveable Member (40) Travel (MM) | Digital Output Lines | | | |
|---|---|---|---|---|---|
| | | (100a) | (100b) | (100c) | (100d) |
| Pretravel | 6 | 1 | 1 | 1 | 1 |
| 1 | 6–9 | 1 | 1 | 0 | 1 |
| 2 | 9–12 | 1 | 1 | 0 | 0 |
| 3 | 12–15 | 1 | 1 | 1 | 0 |
| 4 | 15–18 | 1 | 0 | 1 | 0 |
| 5 | 18–21 | 1 | 0 | 1 | 1 |
| 6 | 21–24 | 1 | 0 | 0 | 1 |
| 7 | 24–27 | 1 | 0 | 0 | 0 |
| 8 | 27–30 | 0 | 0 | 0 | 0 |
| 9 | 30–33 | 0 | 0 | 1 | 0 |
| 10 | 33–36 | 0 | 0 | 1 | 1 |
| 11 | 36–39 | 0 | 0 | 0 | 1 |
| 12 | 39–42 | 0 | 1 | 0 | 1 |
| 13 | 42–45 | 0 | 1 | 0 | 0 |
| 14 | 45–48 | 0 | 1 | 1 | 0 |
| 15 | 48 | 0 | 1 | 1 | 1 |

Industrial Applicability

Operation of the position encoder 10 is best described in relation to its use of the vehicle 12. In response to movement of the control member 28, a power demand signal from the position encoder 10 is delivered to the vehicle controller 26, as hereinafter more fully described, which delivers a motor control signal to the motors 22,24. The vehicle controller 26 is typically a chopper control and the motor control signal is a chopped or pulse width modulated signal having a predetermined duty factor responsive to the power demand signal.

Experience has shown that a continuously variable range of motor control signals is not required to obtain satisfactory motor speed control and that a plurality of discrete incremental motor control signals is fully sufficient. Therefore, a plurality of discrete power demand signals from the position encoder 10 is readily utilized by the vehicle controller 26. Discrete power demand signals are also advantageous when provided to a modern digital computer vehicle controller owing to the need for digital signals as computer inputs.

Reference to Table I during the following discussion will aid in understanding the operation of the position encoder 10. Table I depicts the relationship between the position of the moveable member 40 and the coded digital signals delivered by the position encoder 10. In the application on a vehicle 12, used for illustration, the position of the moveable member 40 is responsive to movement of the control member 28 and the coded digital signals are motor power demand signals.

Movement of the control member 28 causes the sensible members 72a-d to move relative to the sensors 68a-d. In response to the presence of a sensible member 72a-d intermediate the optical emitter and receiver of one of the sensors 68a-d, the respective optical path 70a-d is blocked, the respective sensor photo-transistor turns "OFF", and the respective output line 86a-d approaches the V− or logic "0" level. Conversely, in response to the absence of a sensible member 72a-d within an optical path 70a-d, the respective phototransistor turns "ON", and the respective output line 86a-d approaches the V+ or logic "1" level.

The logic "0" or "1" position signal from each of the sensors 68a-d is delivered by the output lines 86a-d to respective inputs of the "AND" circuits 88a-d and is controllably delivered to the output transistors 96a-d. The output transistors 96a-d collectively, controllably supply the digital signals received to the digital output lines 100a-d, where they are used, for example, by the vehicle controller 26. In normal use, the output lines 100a-d are connected to V+ through respective pull-up resistors located, for example, in the vehicle controller 26, and the digital signals supplied by the output lines 100a-d are the inverse of the digital signals received by the output transistors 96a-d. The inversion of such logic signals is merely a matter of designers choice, as will be appreciated by those skilled in the art.

The arrangement of the sensible members, as depicted in FIG. 5, in cooperation with the "AND" circuits 88a-d, determines the particular one of the predetermined coded digital signals that is formed in response to any one position of the moveable member 40 with respect to the base 30. The arrangement of the preferred embodiment produces digital signals that are advantageously gray coded, as shown in Table I. The progression from one digital signal to the next is substantially linear with respect to the distance moved by the control member 28.

FIGS. 6 and 7, as previously discussed, depict the relationship between the sensors 68a-d and the sensible members 72a-d in response to two different positions of the moveable member 40. As is recorded in Table I, in FIG. 6 the member 40 is in the "pretravel" position which results in a digital signal "1111" being delivered to the vehicle controller 26, and in FIG. 7 the member 40 is in the number 5 position which results in a digital signal "1011" being delivered to the vehicle controller 26.

Variations in the positions of the sensible members 72a-d and the sensors 68a-d and different arrangements of logic gates such as the "AND" circuits 88a-d are possible to provide various coded signal combinations. For example, the position encoder 10 can be designed to provide an output that is non-linear with respect to the distance moved by the control member 28. Likewise, the required resolution of the position encoder 10 dictates the number of sensors 68a-d and sensible members 72a-d required. Such alterations of the position encoder 10 will be apparent to those skilled in the art.

A fault condition causing excessive current to flow through one or more of the output transistors 96a-d to V− also causes an increase in the voltage formed across the current sensing resistor 98. A predetermined voltage across the resistor 98 turns the transistor 90 "ON". After a short time delay imposed by the time constant of the resistor 92 and the capacitor 94, the inputs of the "AND" circuits connected to the collector of the transistor 90 approach the V− or logic "0" level and the output transistors 96a-d are turned "OFF". In response, a predetermined one of the coded digital signals, specifically "1111", is delivered to the digital output lines 100a-d for the duration of the fault condition.

Likewise, most other failure modes of the position encoder 10, for example, failure of the power supply or of one or more of the series connected diodes, also causes the digital signal "1111" to be delivered to the digital output lines 100a-d. As shown in Table I, the vehicle controller 26 interprets the digital signal "1111" as the lowest or zero motor power demand signal and turns "OFF" the electric motors 22,24. Therefore, most failure modes of the position encoder 10 advantageously result in the vehicle 12 stopping until the fault is cleared.

Other aspects, objects, advantages and uses of this invention can be obtained from a study of the drawings, the disclosure, and the appended claims.

We claim:

1. A position encoder for sensing a plurality of positions of a control member of a vehicle, comprising:

a base having first and second end portions and a central longitudinal axis passing through said end portions;

a moveable member having a substantially planar first mounting surface and a first end portion, said mounting surface having a plurality of spaced apart pathways extending substantially parallel to one another and to said central axis along said first mounting surface, said moveable member first end portion passing through said base first end portion and being connectable to said control member, said moveable member being moveable along said central axis between said base end portions in response to movement of said control member;

a mounting member having a substantially planar second mounting surface positioned substantially parallel to and spaced apart from said first mounting surface, said second mounting surface having a plurality of spaced apart pathways extending substantially parallel to one another along said second mounting surface, each of said pathways being aligned with a respective one of said first mounting surface pathways;

a plurality of sensors, each of said sensors being mounted on said second mounting surface along a different one of said second mounting surface pathways; and, a plurality of sensible members, each of said sensible members being mounted on said first mounting surface along said first mounting surface pathways and extending toward said second mounting surface, said sensible members being of a construction and location sufficient for sensing by predetermined ones of said sensors in response to the position of said control member.

2. A position encoder, as set forth in claim 1, including means for urging said moveable member along said axis toward said base first end portion.

3. A position encoder, as set forth in claim 2, wherein said moveable member includes a second end portion and said urging means includes a spring compressably positioned between said moveable member second end portion and said base second end portion.

4. A position encoder, as set forth in claim 3, wherein said base includes a projection attached to said base second end portion and extending along said axis toward said base first end portion, said spring being positioned about and retained substantially parallel to said axis by said projection.

5. A position encoder, as set forth in claim 1, wherein each of said sensors includes an optical transmission path, said sensible members being of a construction and location sufficient for interrupting or failing to interrupt preselected ones of said optical paths in response to the position of said moveable member relative to said mounting member.

6. A position encoder, as set forth in claim 5, wherein each of said sensible members is a light blocking fin extending substantially perpendicularly from said moveable member mounting surface.

7. A position encoder, as set forth in claim 1, wherein each of said sensors delivers a position signal in response to the relative position of said sensible members and said respective sensor, and including electric circuit means for receiving said position signals from each of said sensors, controllably combining said received signals, and delivering one of a plurality of predetermined coded digital signals in response to said received signals.

8. A position encoder, as set forth in claim 7, wherein said coded digital signals are gray coded.

9. A position encoder, as set forth in claim 7, wherein said electric circuit means includes a plurality of logical "AND" circuits, each of said "AND" circuits having an output and at least two inputs, respective ones of said inputs being connected to respective ones of said sensors.

10. A position encoder, as set forth in claim 9, wherein said electric circuit means includes protection means for producing a predetermined one of said coded digital signals in response to a predetermined fault condition of said electric circuit means.

11. A position encoder, as set forth in claim 10, wherein said protection means is connected to respective ones of said "AND" circuit inputs.

12. A position encoder, as set forth in claim 1, wherein said moveable member and at least one of said base and said mounting member includes one or more adjacent engageable surfaces, at least one of said engageable surfaces including a plurality of spaced apart ribs extending outwardly from and substantially perpendicular to said engageable surface and substantially parallel to said central axis, said ribs being in sliding engageable contact with the other of said adjacent engageable surfaces.

13. A position encoder, as set forth in claim 1, including a shaft attached to said moveable member first end portion and passing through said base first end portion, said shaft having a shock absorbing member connected to said shaft between said moveable member and base first end portions.

14. A position encoder, as set forth in claim 13, wherein said shaft includes a groove and said shock absorbing member is a bevel washer positioned in said groove and extending radially outwardly from said shaft.

15. A position encoder for sensing a plurality of positions of a control member of a vehicle, comprising:
a base having first and second end portions and a central longitudinal axis passing through said end portions;
a moveable member having a substantially planar first mounting surface and a first end portion, said mounting surface having a plurality of spaced apart pathways extending substantially parallel to one another and to said central axis along said first mounting surface, said moveable member first end portion passing through said base first end portion and being connectable to said control member, said moveable member being moveable along said central axis between said base end portions in response to movement of said control member;
a projection attached to said base second end portion and extending along said axis toward said base first end portion;
a spring compressably positioned between said moveable member second end portion and said base second end portion, said spring being positioned about and retained by said projection;
a mounting member having a substantially planar second mounting surface positioned substantially parallel to and spaced apart from said first mounting surface, said second mounting surface having a plurality of spaced apart pathways extending substantially parallel to one another along said second mounting surface, each of said pathways being alignable with a respective one of said first mounting surface pathways;
a plurality of sensors, each of said sensors having an optical path and being mounted on said second mounting surface along a different one of said second mounting surface pathways; and,
a plurality of sensible members, each of said sensible members being mounted on said first mounting surface along said first mounting surface pathways and extending toward said second mounting surface, said sensible members being of a construction and location sufficient to interrupt and fail to interrupt said sensor optical paths in response to the position of said control member.

16. A position encoder, as set forth in claim 15, wherein each of said sensors delivers a position signal in response to the relative position of said sensible members and said respective sensor and including electric circuit means for receiving said position signals from each of said sensors, controllably combining said received signals, and delivering one of a plurality of predetermined gray coded digital signals in response to said received signals.

* * * * *